(12) United States Patent
Zhang et al.

(10) Patent No.: US 12,135,843 B2
(45) Date of Patent: Nov. 5, 2024

(54) TOUCH-CONTROL DISPLAY PANEL AND PREPARATION METHOD THEREFOR, AND DISPLAY APPARATUS

(71) Applicants: Chengdu BOE Optoelectronics Technology Co., Ltd., Sichuan (CN); BOE Technology Group Co., Ltd., Beijing (CN)

(72) Inventors: Yuanqi Zhang, Beijing (CN); Ping Wen, Beijing (CN); Shun Zhang, Beijing (CN); Yang Zeng, Beijing (CN); Wei Wang, Beijing (CN); Yu Wang, Beijing (CN); Yi Zhang, Beijing (CN); Chang Luo, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 18/025,448

(22) PCT Filed: Sep. 3, 2021

(86) PCT No.: PCT/CN2021/116369
§ 371 (c)(1),
(2) Date: Mar. 9, 2023

(87) PCT Pub. No.: WO2022/083315
PCT Pub. Date: Apr. 28, 2022

(65) Prior Publication Data
US 2023/0325016 A1 Oct. 12, 2023

(30) Foreign Application Priority Data

Oct. 20, 2020 (CN) .......................... 202011122519.9

(51) Int. Cl.
*G06F 3/041* (2006.01)
*H10K 59/12* (2023.01)
*H10K 59/40* (2023.01)

(52) U.S. Cl.
CPC ....... *G06F 3/0412* (2013.01); *H10K 59/1201* (2023.02); *H10K 59/40* (2023.02);
(Continued)

(58) Field of Classification Search
CPC ......... G06F 3/0412; G06F 2203/04102; G06F 2203/04103; H10K 59/1201; H10K 59/40
See application file for complete search history.

(56) References Cited

U.S. PATENT DOCUMENTS

2019/0214446 A1\* 7/2019 Kim ..................... H10K 59/124
2020/0350512 A1\* 11/2020 Guo ....................... H10K 59/12
(Continued)

FOREIGN PATENT DOCUMENTS

CN     107179623 A    9/2017
CN     107204402 A    9/2017
(Continued)

OTHER PUBLICATIONS

International Search Report and Written Opinion mailed on Nov. 17, 2021, in corresponding PCT/CN2021/116369, 8 pages.
(Continued)

*Primary Examiner* — Lixi C Simpson
(74) *Attorney, Agent, or Firm* — XSENSUS LLP

(57) ABSTRACT

A touch-control display panel and a preparation method therefor, and a display apparatus, which relate to the technical field of display. The touch-control display panel comprises a base substrate (100), a display device layer (200) and a touch-control functional layer (300), which are sequentially stacked. The touch-control functional layer (300) comprises an inorganic dielectric layer (301) and an
(Continued)

organic protective layer (315) that are sequentially arranged on the display device layer (200) in a stacked manner, wherein the orthographic projection of at least part of the edge of the inorganic dielectric layer (301) on the base substrate (100) is located within the orthographic projection of the organic protective layer (315) on the base substrate (100). The touch-control display panel has a better preparation yield.

15 Claims, 9 Drawing Sheets

(52) U.S. Cl.
CPC .............. *G06F 2203/04102* (2013.01); *G06F 2203/04103* (2013.01)

(56) References Cited

U.S. PATENT DOCUMENTS

2021/0193960 A1* 6/2021 Song .................... H10K 59/124
2021/0242284 A1* 8/2021 Kim ..................... G06F 3/0445

FOREIGN PATENT DOCUMENTS

| CN | 109308139 A | 2/2019 |
| CN | 109407872 A | 3/2019 |
| CN | 107204402 B | 5/2019 |
| CN | 112242431 A | 1/2021 |

OTHER PUBLICATIONS

Office Action issued on Mar. 2, 2022, in corresponding Chinese patent Application No. 202011122519.9, 19 pages.

* cited by examiner

TOUCH-CONTROL DISPLAY PANEL AND PREPARATION METHOD THEREFOR, AND DISPLAY APPARATUS

CROSS REFERENCE TO RELATED APPLICATION(S)

The present disclosure is a 35 U.S.C. 371 national phase application of PCT International Application No. PCT/CN2021/116369 filed on Sep. 3, 2021, which claims the priority of the Chinese patent application with the application number of 202011122519.9 and titled with "Touch Display Panel and Manufacturing Method Thereof, and Display Device" filed on Oct. 20, 2020, the entire contents of both are of which is incorporated herein by reference in its entirety their entireties.

TECHNICAL FIELD

The present disclosure relates to the field of display technology, in particular to a touch display panel, a manufacturing method thereof, and a display device.

BACKGROUND

When Flexible Metal Layer on Cell (FMLOC) is used to manufacture a touch display panel, the touch film layer is prone to peeling, which leads to failure of the entire substrate motherboard, reduces the production yield, and increases the production cost.

The above information disclosed in the Background section is only for enhancing understanding of the background of the present disclosure, and therefore may contain information that does not constitute the prior art that is already known to a person of ordinary skills in the art.

SUMMARY

The purpose of the present disclosure is to provide a touch display panel and a manufacturing method thereof, so as to improve the yield of the touch display panel.

In order to achieve the above-mentioned purpose, the present disclosure adopts the following technical solutions.

According to a first aspect of the present disclosure, a touch display panel is provided, including: a base substrate; a display device layer, arranged on a side of the base substrate; and a touch function layer, arranged on a side of the display device layer away from the base substrate. The touch function layer includes an inorganic dielectric layer and an organic protection layer sequentially stacked on the display device layer. The orthographic projection of at least part of an edge of the inorganic dielectric layer on the base substrate is located within the orthographic projection of the organic protection layer on the base substrate.

In an exemplary embodiment of the present disclosure, the touch function layer further includes a first electrode layer and a second electrode layer. The inorganic dielectric layer includes a dielectric buffer layer and a dielectric insulation layer. The dielectric buffer layer, the first electrode layer, the dielectric insulation layer, the second electrode layer, and the organic protection layer are sequentially stacked on a side of the display device layer away from the base substrate.

In an exemplary embodiment of the present disclosure, the orthographic projection of the inorganic dielectric layer on the base substrate is located within the orthographic projection of the organic protection layer on the base substrate.

In an exemplary embodiment of the present disclosure, the distance between any point on the edge of the orthographic projection of the inorganic dielectric layer on the base substrate and any point on the edge of the orthographic projection of the organic protection layer on the base substrate has a minimum value being not less than 80 microns.

In an exemplary embodiment of the present disclosure, there is a gap between an edge of the touch display panel and an edge of the organic protection layer close to the edge of the touch display panel.

In an exemplary embodiment of the present disclosure, the display device layer includes an organic material layer. The peripheral area of the touch display panel includes a first area. In the first area, the edge of the organic material layer is located within the edge of the inorganic dielectric layer.

In an exemplary embodiment of the present disclosure, the display device layer further includes an inorganic insulation layer, and the organic material layer is located on a side of the inorganic insulation layer away from the base substrate.

In the first area, the edge of the organic material layer is located within the edge of the inorganic insulation layer, and the part of the inorganic insulation layer beyond the organic material layer is directly connected with the part of the inorganic dielectric layer beyond the organic material layer.

In an exemplary embodiment of the present disclosure, in the first area, there is a crack barrier area between the edge of the inorganic dielectric layer and the edge of the touch display panel, and the crack barrier area extends along the extension direction of the edge of the touch display panel.

In the first area, the inorganic insulation layer covers the crack barrier area, and a groove extending along the extension direction of the edge of the touch display panel is arranged in the crack barrier area. The organic protection layer covers the crack barrier area.

In an exemplary embodiment of the present disclosure, the peripheral area of the touch display panel further includes a second area. In the second area, the edge of the touch display panel is arc-shaped, and the organic material layer extends to the edge of the touch display panel.

In an exemplary embodiment of the present disclosure, the peripheral area of the touch display panel further includes a bendable area.

The organic material layer covers the bendable area. The inorganic dielectric layer and the organic protection layer are hollowed out in the bendable area. The edge of the organic protection layer close to the bendable area is located between the bendable area and the edge of the inorganic dielectric layer close to the bendable area.

In an exemplary embodiment of the present disclosure, the touch display panel is provided with a through hole, and the orthographic projection of the organic protection layer on the base substrate surrounds the orthographic projection of the through hole on the base substrate.

According to a second aspect of the present disclosure, a touch display panel is provided, including: a base substrate; a display device layer, arranged on a side of the base substrate, the display device layer including an organic material layer; and a touch function layer, arranged on a side of the display device layer away from the base substrate, the touch function layer including an inorganic dielectric layer. In at least a partial region of the peripheral area of the touch display panel, the edge of the organic material layer is located within the edge of the inorganic dielectric layer.

According to a third aspect of the present disclosure, a display device is provided, including the above-mentioned touch display panel.

According to a fourth aspect of the present disclosure, a method for manufacturing a touch display panel is provided, including: providing a base substrate; forming a display device layer on a side of the base substrate; and forming a touch function layer on a side of the display device layer away from the base substrate. The touch function layer includes an inorganic dielectric layer and an organic protection layer sequentially stacked on the display device layer. The orthographic projection of at least part of the edge of the inorganic dielectric layer on the base substrate is located within the orthographic projection of the organic protection layer on the base substrate.

In an exemplary embodiment of the present disclosure, the step of forming the touch function layer on the side of the display device layer away from the base substrate includes: forming the inorganic dielectric layer and the organic protection layer on the side of the display device layer away from the base substrate, such that the orthographic projection of the inorganic dielectric layer on the base substrate is located within the orthographic projection of the organic protection layer on the base substrate.

In an exemplary embodiment of the present disclosure, the peripheral area of the touch display panel includes a first area.

The step of forming the display device layer on the side of the base substrate includes: forming an organic material layer of the display device layer.

The step of forming the touch function layer on the side of the display device layer away from the base substrate includes: forming the inorganic dielectric layer such that in the first area, an edge of the organic material layer is located within an edge of the inorganic dielectric layer.

In an exemplary embodiment of the present disclosure, the step of forming the display device layer on the side of the base substrate further includes: forming the inorganic insulation layer of the display device layer, such that the organic material layer is located on the side of the inorganic insulation layer away from the base substrate, and in the first area, the edge of the organic material layer is located within the edge of the inorganic insulation layer.

The step of forming the touch function layer on the side of the display device layer away from the base substrate further includes: while forming the inorganic dielectric layer, in the first area, directly connecting the part of the inorganic insulation layer beyond the organic material layer with the part of the inorganic dielectric layer beyond the organic material layer.

In an exemplary embodiment of the present disclosure, in the first area, the touch display panel has a crack barrier area close to the edge of the touch display panel and extending along the extension direction of the edge of the touch display panel.

The step of forming the display device layer on the side of the base substrate further includes: while forming the inorganic insulation layer, in the first area, covering the crack barrier area by the inorganic insulation layer and providing a groove in the crack barrier area. The groove extends along the extension direction of the edge of the touch display panel.

The step of forming the touch function layer on the side of the display device layer away from the base substrate further includes: while forming the organic protection layer, in the first area, covering the crack barrier area by the organic protection layer.

In an exemplary embodiment of the present disclosure, the peripheral area of the touch display panel further includes a second area, and the edge of the touch display panel in the second area is arc-shaped.

The step of providing the base substrate includes: providing a substrate motherboard, the substrate motherboard including base substrates for a plurality of touch display panels and cutting channel areas surrounding each of the base substrates.

The step of forming the display device layer on the side of the base substrate includes: forming an organic material layer for each of the touch display panels on the substrate motherboard, where the organic material layer also extends to cover a part of the cutting channel area close to the second area.

The step of forming the touch function layer on the side of the display device layer away from the base substrate includes: while forming the inorganic dielectric layer, in the second area, rendering the edge of the inorganic dielectric layer to not reach the edge of the touch display panel.

In an exemplary embodiment of the present disclosure, the peripheral area of the touch display panel further includes a bendable area.

The step of forming the display device layer on the side of the base substrate includes: while forming the organic material layer of the display device layer, covering the bendable area by the organic material layer.

The step of forming the touch function layer on the side of the display device layer away from the base substrate includes: forming the touch function layer so that the inorganic dielectric layer and the organic protection layer are hollowed out in the bendable area. The edge of the organic protection layer close to the bendable area is located between the bendable area and the edge of the inorganic dielectric layer close to the bendable area.

The touch display panel and the manufacturing method thereof provided by the present disclosure help to avoid or weaken water vapor intrusion into the junction area between the inorganic dielectric layer and the display device layer while manufacturing the touch function layer, thereby avoiding decrease of the yield rate caused by peeling of the touch function layer, and improving the manufacturing yield of the touch display panel.

BRIEF DESCRIPTION OF THE DRAWINGS

The above and other features and advantages of the present disclosure will become more apparent by describing in detail example embodiments thereof with reference to the accompanying drawings.

Figure 1:
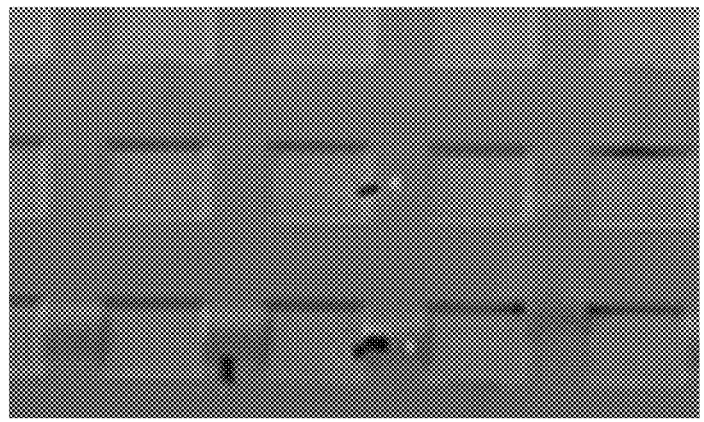
FIG. 1 is a photo showing peeling of the touch function layer of the touch display panel in the related art.

The reference signs about the main components in the figures are detailed as follows:

100. base substrate; 200. display device layer; 201. organic material layer; 202. inorganic insulation layer; 211. buffer material layer; 212. semiconductor layer; 213. gate insulation layer; 214. gate layer; 215. interlayer dielectric layer; 216, source-drain metal layer; 217, planarization layer; 221, pixel electrode layer; 222, pixel definition layer; 223, support post layer; 224, organic light-emitting functional layer; 225, common electrode layer; 231, first inorganic encapsulation layer; 232, organic encapsulation layer; 233, second inorganic encapsulation layer; 300, touch function layer; 301, inorganic dielectric layer; 311, dielectric buffer layer; 312, first electrode layer; 313, dielectric insulation layer; 314, second electrode layer; 315, organic protection layer; 400, substrate motherboard; 401, cutting channel area; 402, support substrate; A, display area; B, peripheral area; 501, first area; 5011, crack barrier area; 5012, groove; 5013, crack dam; 502, second area; 503, third area; 504, through-hole area; 5041, through-hole encapsulation area; 601, fan-out area; 602, bendable area; 603, chip binding area; 604, circuit board binding area; 605, connection lead area; 606, test area.

Detailed Description of the Embodiments

Example embodiments will now be described more fully with reference to the accompanying drawings. Example embodiments may, however, be embodied in many forms, and should not be construed as limited to the examples set forth herein. Rather, these embodiments are provided so that the present disclosure will be thorough and complete, and will fully convey the concept of example embodiments to those skilled in the art. The described features, structures, or characteristics may be combined in any suitable manner in one or more embodiments. In the following description, numerous specific details are provided in order to give a thorough understanding about embodiments of the present disclosure.

In the drawings, the thicknesses of areas and layers may be exaggerated for clarity. The same reference numerals in the drawings denote the same or similar structures, and thus their detailed descriptions will be omitted.

The described features, structures, or characteristics may be combined in any suitable manner in one or more embodiments. In the following description, numerous specific details are provided in order to give a thorough understanding about embodiments of the present disclosure. However, one skilled in the art will appreciate that the technical solutions of the present disclosure may be practiced without one or more of the specific details, or other methods, components, materials, etc. may be employed. In other instances, well-known structures, materials, or operations are not shown or described in detail to avoid obscuring the main technical concept of the present disclosure.

The terms "a", "an" and "the" are used to indicate the presence of one or more elements or components, etc. Additional elements or components, etc. may be present in addition to the listed elements or components, etc. The words "first" and "second" etc. are used only as marks, not to limit the number of their objects.

In the related art, when the FMLOC technology is used to manufacture the touch display panel, the touch function layer is prone to peeling off. Referring to FIG. 1, the touch function layer is peeled off at position M. After the touch function layer is peeled off, the entire production chamber will be polluted, thereby resulting in failure of the entire substrate motherboard (such as the entire glass substrate), which greatly reduces the production capacity and increases the production cost. The present inventor(s) has conducted an in-depth research on this problem, combined with a large number of process analysis and verification, and found that the bonding force between the inorganic dielectric layer in the touch function layer and the organic material layer in the display panel is poor. In the FMLOC process, after absorbing moisture, the organic material layer in the display panel will further reduce the binding force with the inorganic dielectric layer in the touch function layer, thereby causing the touch function layer to peel off.

Embodiment One

Figure 2:
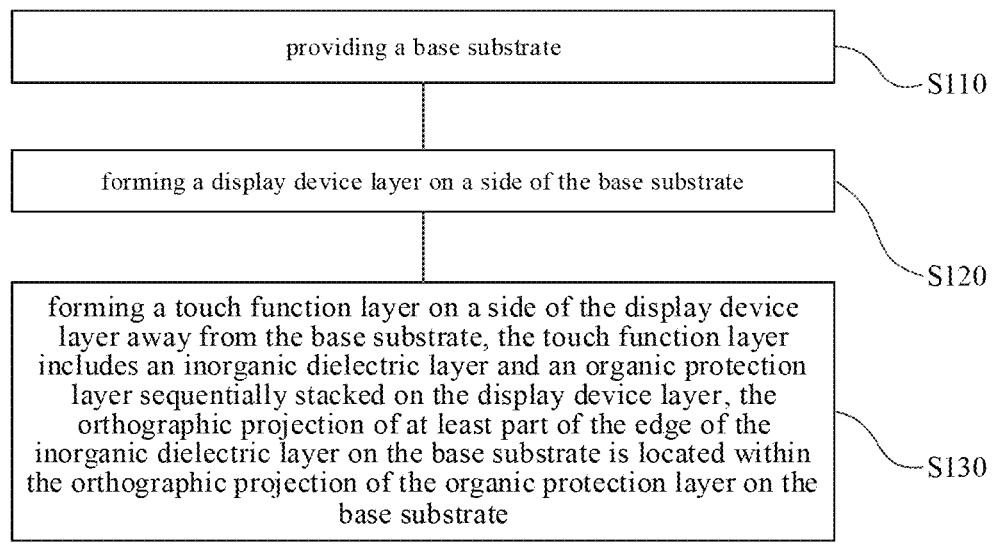
FIG. 2 is a schematic flowchart of a method for manufacturing a touch display panel according to an embodiment of the present disclosure.

The present disclosure provides a method for manufacturing a touch display panel. As shown in FIG. 2, the method for manufacturing a touch display panel includes the following steps S110, S120, and S130.

Figure 3:
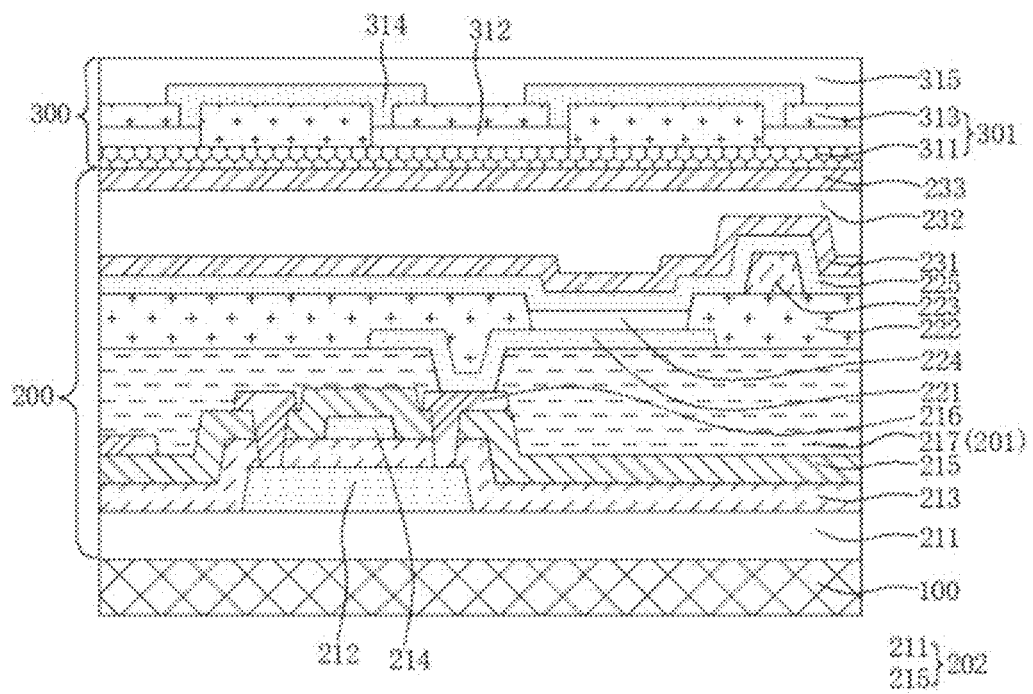
FIG. 3 is a schematic structural diagram of a touch display panel in a display area according to an embodiment of the present disclosure.

In step S110, referring to FIG. 3, a base substrate 100 is provided.

In step S120, referring to FIG. 3, a display device layer 200 is formed on a side of the base substrate 100.

In step S130, referring to FIG. 3, a touch function layer 300 is formed on a side of the display device layer 200 away from the base substrate 100. The touch function layer 300 includes an inorganic dielectric layer 301 and an organic protection layer 315 stacked on the display device layer 200 in sequence. Referring to FIG. 11 to FIG. 15 as well as FIG. 17, the orthographic projection of at least part of the edge of the inorganic dielectric layer 301 on the base substrate 100 is located within the orthographic projection of the organic protection layer 315 on the base substrate 100.

Figure 17:
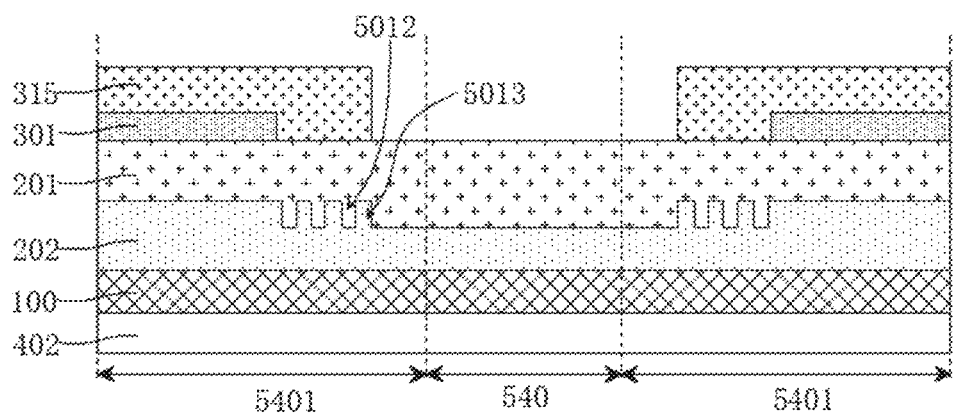
FIG. 17 is a schematic cross-sectional view at the position PP' in FIG. 16, where only the relative positions among the support substrate, the base substrate, the inorganic insulation layer, the organic material layer, the inorganic dielectric layer, and the organic protection layer are shown.

According to the method for manufacturing a touch display panel provided in the present disclosure, referring to FIG. 11 to FIG. 15 as well as FIG. 17, when forming the touch function layer 300, at least part of the edge of the inorganic dielectric layer 301 may be covered by the organic protection layer 315. That is, the junction area between the inorganic dielectric layer 301 and the display device layer 200 is at least partially covered by the organic protection layer 315. The organic protection layer 315 helps to block external water vapor and reduce the invasion risk of external water vapor into the junction area between the inorganic dielectric layer 301 and the display device layer 200, thereby reducing the risk of peeling off the inorganic dielectric layer 301 from the display device layer 200. Moreover, the organic protection layer 315 also helps to effectively balance the stress of the inorganic dielectric layer 301, avoiding peeling off of the inorganic dielectric layer 301 under stress, and further reducing the risk of peeling off the touch function layer 300. In this way, the method for manufacturing a touch display panel has a high production yield, which helps to improve the production capacity of the touch display panel and reduce the cost of the touch display panel.

According to the method for manufacturing a touch display panel provided in the present disclosure, the manufactured touch display panel may include a base substrate 100, a display device layer 200, and a touch function layer 300 stacked in sequence. The touch function layer 300 includes the inorganic dielectric layer 301 and the organic protection layer 315 sequentially stacked on the display device layer 200. The orthographic projection of at least part of the edge of the inorganic dielectric layer 301 on the base substrate 100 is located within the orthographic projection of the organic protection layer 315 on the base substrate 100.

In the following, the method for manufacturing a touch display panel provided by the present disclosure, and the steps, structure, principle, and effect of the manufactured touch display panel will be further explained and described in conjunction with the accompanying drawings.

In step S110, referring to FIG. 3, a base substrate 100 may be provided. The base substrate 100 may be a base substrate 100 of inorganic material, or may be a base substrate 100 of organic material. For example, in an embodiment of the present disclosure, the material of the base substrate 100 may be glass materials such as soda-lime glass, quartz glass, sapphire glass, or may be metallic material such as stainless steel, aluminum, nickel, etc. In another embodiment of the present disclosure, the material of the base substrate 100 may be polymethyl methacrylate (PMMA), polyvinyl alcohol (PVA), polyvinyl phenol (PVP), polyether sulfone (PES), polyimide, polyamide, polyacetal, polycarbonate (PC), polyethylene terephthalate (PET), polyethylene naphthalate (PEN), or a combination thereof. In another embodiment of the present disclosure, the base substrate 100 may also be a flexible base substrate 100. For example, the material of the base substrate 100 may be polyimide (PI). The base substrate 100 may also be a composite of multilayer materials. For example, in an embodiment of the present disclosure, the base substrate 100 may include a bottom film, a pressure-sensitive adhesive layer, a first polyimide layer, and a second polyimide layer.

In some embodiments, referring to FIG. 11 to FIG. 15 as well as FIG. 17, a removable support substrate 402 may also be provided on the side of the base substrate 100 away from the display device layer 200. After finishing the manufacture of the touch display panel, the support substrate 402 may be removed. For example, the base substrate 100 may be a flexible base substrate 100, such as a polyimide base substrate 100. In step S110, the flexible base substrate 100 may be arranged on a glass substrate acting as the support substrate 402. After the manufacture of the touch display panel is completed, the glass substrate may be removed.

Figure 9:
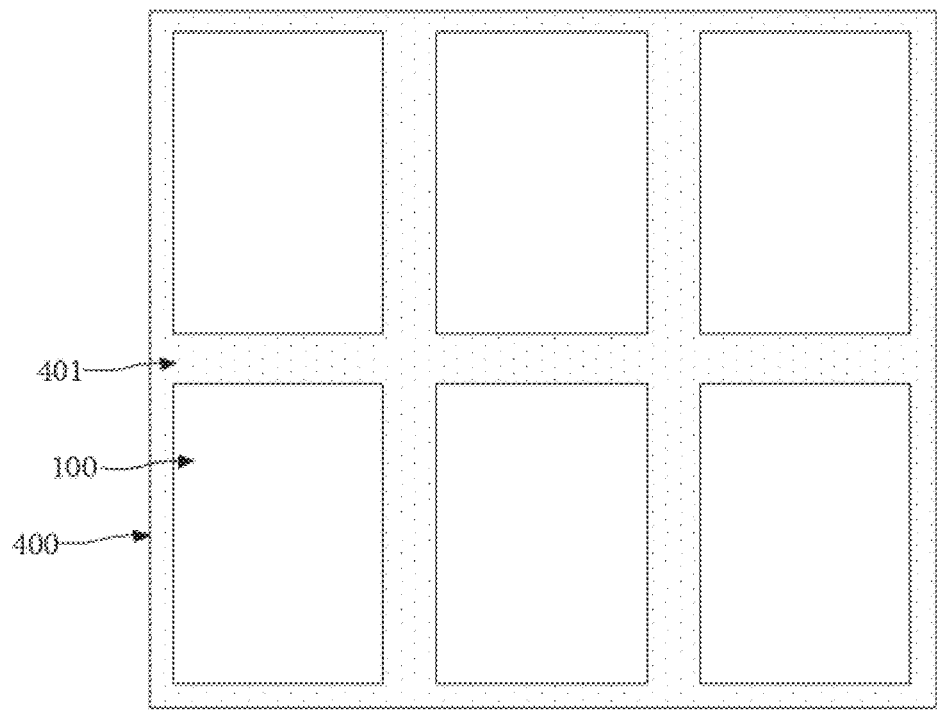
FIG. 9 is a schematic top view of a substrate motherboard according to an embodiment of the present disclosure.

In an embodiment of the present disclosure, in step S110, referring to FIG. 9, a substrate motherboard 400 may be provided, and the substrate motherboard 400 may include base substrates 100 for a plurality of touch display panels as well as cutting channel areas 401 between the base substrates 100. Each touch display panel may be manufactured on the substrate motherboard 400, and each touch display panel may be obtained by cutting after the manufacture is completed. After cutting, the cutting channel areas 401 are removed.

In step S120, referring to FIG. 3, a display device layer 200 may be formed on a side of the base substrate 100. When the base substrate 100 is disposed on the support substrate 402, the display device layer 200 may be formed on the side of the base substrate 100 away from the support substrate 402.

The display device layer 200 may be provided with light-emitting elements distributed in an array. The light-emitting element may be organic light-emitting diode (OLED), macromolecular organic light-emitting diode (PLED), light-emitting diode (LED), micro light-emitting diode (Micro LED), mini light-emitting diode (MiNi LED), or other active light-emitting component. The display device layer 200 may also be provided with a driving circuit for driving each light-emitting element to emit light independently. The driving circuit may be an active driving circuit or a passive driving circuit.

As follows, the display device layer 200 will be further explained and described by taking the touch display panel being an OLED touch display panel as an example.

The display device layer 200 may include a driving circuit layer, an organic light-emitting layer, and a thin film encapsulation layer stacked on a side of the base substrate 100 in sequence. The organic light-emitting layer is provided with OLEDs distributed in array. The driving circuit layer is provided with a driving circuit for driving the corresponding OLEDs, and the thin-film encapsulation layer is used to protect the OLEDs. Thus, the touch display panel is an OLED touch display panel.

The driving circuit layer may be formed with a plurality of pixel driving circuits, and each pixel driving circuit is used to drive a corresponding OLED. Any pixel driving circuit may include a thin film transistor and a storage capacitor. The thin film transistor may be a top gate thin film transistor, a bottom gate thin film transistor, or a double gate thin film transistor. The material of the active layer of the thin film transistor may be amorphous silicon semiconductor material, low temperature polysilicon semiconductor material, metal oxide semiconductor material, organic semiconductor material, or other types of semiconductor material. The thin film transistor may be N-type thin film transistor or P-type thin film transistor. The present disclosure does not limit the specific types of thin film transistors.

The driving circuit layer may include a semiconductor layer 212, a gate insulation layer 213, a gate layer 214, an interlayer dielectric layer 215, a source-drain metal layer 216, and a planarization layer 217 stacked between the base substrate 100 and the organic light-emitting layer. Each thin film transistor and the storage capacitor may be formed by film layers such as semiconductor layer 212, gate insulation layer 213, gate layer 214, interlayer dielectric layer 215, source-drain metal layer 216, and so on. The positional relationship among various film layers may be determined according to the film layer structure of the thin film transistor. For example, in an embodiment of the present disclosure, the driving circuit layer may include a semiconductor layer 212, a gate insulation layer 213, a gate layer 214, an interlayer dielectric layer 215, a source-drain metal layer 216, and a planarization layer 217 stacked in sequence. The thin film transistor (TFT) formed in this way is a top gate TFT. For another example, in another embodiment of the present disclosure, the driving circuit layer may include a gate layer 214, a gate insulation layer 213, a semiconductor layer 212, an interlayer dielectric layer 215, and a source-drain metal layer 216 stacked in sequence. The thin film transistor thus formed is a bottom gate thin film transistor. The driving circuit layer may also adopt a double gate layer structure. That is, the gate layer 214 may include a first gate layer and a second gate layer. The gate insulation layer 213 may include a first gate insulation layer for isolating the semiconductor layer 212 from the first gate layer, and a second gate insulation layer for isolating the first gate layer from the second gate layer. For example, in an embodiment of the present disclosure, the driving circuit layer may include a semiconductor layer 212, a first gate insulation layer, a first gate layer, a second gate insulation layer, a second gate layer, an interlayer dielectric layer 215, a source-drain metal layer 216, and a planarization layer 217 stacked in sequence on a side of the base substrate 100.

Optionally, the driving circuit layer may further include a passivation layer, and the passivation layer may be disposed on the surface of the source-drain metal layer 216 away from the base substrate 100, so as to protect the source-drain metal layer 216.

Optionally, the driving circuit layer may further include a buffer material layer 211 disposed on the surface of the base substrate 100, and the semiconductor layer 212, the gate layer 214, and the like are located on a side of the buffer material layer 211 away from the base substrate 100. The material of the buffer material layer 211 may be inorganic insulation materials such as silicon oxide and silicon nitride. Further optionally, the driving circuit layer may also include a shielding layer, and the shielding layer may be located within the buffer material layer 211, so as to provide electromagnetic shielding effect or light shielding effect for at least a partial area of the driving circuit layer, or to be used as an alignment mark.

The organic light-emitting layer is disposed on the side of the driving circuit layer away from the base substrate 100, which may include a pixel electrode layer 221, a pixel definition layer 222, a support post layer 223, an organic light-emitting functional layer 224, and a common electrode layer 225 that are stacked in sequence. The pixel electrode layer 221 has a plurality of pixel electrodes in the display area of the touch display panel. The pixel definition layer 222 has a plurality of through pixel openings corresponding to the plurality of pixel electrodes respectively in the display area. Any one of the pixel openings exposes at least a partial area of the corresponding pixel electrode. The support post layer 223 includes a plurality of support posts in the display area A. The support posts are located on the surface of the pixel definition layer 222 away from the base substrate 100, so as to support a fine metal mask (FMM) during the evaporation process. The organic light-emitting functional layer 224 at least covers the pixel electrode exposed by the pixel definition layer 222. The organic light-emitting functional layer 224 may include an organic electroluminescent material layer, and may include one or more of a hole injection layer, a hole transport layer, an electron blocking layer, a hole blocking layer, an electron transport layer, and an electron injection layer. Each film layer of the organic light-emitting functional layer 224 may be manufactured by an evaporation process, and a fine metal mask or an open mask may be used to define the pattern of each film layer during evaporation. The common electrode layer 225 may cover the organic light-emitting functional layer 224 in the display area A. In this way, the pixel electrode, the common electrode layer 225, as well as the organic light-emitting function layer 224 located between the pixel electrode and the common electrode layer 225 form an organic light-emitting diode.

The thin film encapsulation layer may include an inorganic encapsulation layer and an organic encapsulation layer 232 that are alternately stacked. The inorganic encapsulation layer can effectively block external moisture and oxygen, and prevent water and oxygen from invading the organic light-emitting functional layer 224 to cause material degradation. Optionally, the edge of the inorganic encapsulation layer may be located in the peripheral area, especially on the side of the dam away from the display area, so as to achieve a better water-oxygen isolation effect by means of the dam. The organic encapsulation layer 232 is located between two adjacent inorganic encapsulation layers, so as to achieve planarization and reduce the stress between the inorganic encapsulation layers. The edge of the organic encapsulation layer 232 is located between the display area A and the dam. Exemplarily, the thin film encapsulation layer includes a first inorganic encapsulation layer 231, an organic encapsulation layer 232, and a second inorganic encapsulation layer 233 sequentially stacked on the side of the organic light-emitting layer away from the base substrate 100.

In step S130, the touch function layer 300 may be formed on the side of the display device layer 200 away from the base substrate 100. The touch function layer 300 may also include an inorganic dielectric layer 301 and an organic protection layer 315 in addition to the touch electrode layer.

Optionally, the touch electrode layer includes a first electrode layer 312 and a second electrode layer 314. The inorganic dielectric layer 301 includes a dielectric buffer layer 311 and a dielectric insulation layer 313. The dielectric buffer layer 311, the first electrode layer 312, the dielectric insulation layer 313, the second electrode layer 314, and the organic protection layer 315 are sequentially stacked on the side of the display device layer 200 away from the base substrate 100. In this way, the touch function layer 300 includes a dielectric buffer layer 311, a first electrode layer 312, a dielectric insulation layer 313, a second electrode layer 314, and an organic protection layer 315 that are sequentially stacked on the side of the display device layer 200 away from the base substrate 100.

Optionally, the material of the dielectric buffer layer 311 may be silicon nitride.

Optionally, the material of the dielectric insulation layer 313 may be silicon nitride.

Optionally, the material of the organic protection layer 315 may be polyimide.

In an embodiment of the present disclosure, the display device layer 200 includes a thin film encapsulation layer. The second inorganic encapsulation layer 233 of the thin film encapsulation layer may be re-used as the dielectric buffer layer 311 of the touch function layer 300.

The material of the first electrode layer 312 may be selected from metals, alloys, conductive metal oxides, conductive organic materials, or other conductive materials. The first electrode layer 312 may include a layer of conductive material, or may include multiple layers of stacked conductive materials. Exemplarily, in an embodiment of the present disclosure, the first electrode layer 312 may include a titanium metal layer, an aluminum metal layer, and a titanium metal layer stacked in sequence. In another embodiment of the present disclosure, the first electrode layer 312 may include an indium tin oxide layer, a silver metal layer, and an indium tin oxide layer stacked in sequence.

The material of the second electrode layer 314 may be selected from metals, alloys, conductive metal oxides, conductive organic materials, or other conductive materials. The second electrode layer 314 may include a layer of conductive material, or may include multiple layers of stacked conductive materials. Exemplarily, in an embodiment of the present disclosure, the second electrode layer 314 may include a titanium metal layer, an aluminum metal layer, and a titanium metal layer stacked in sequence. In another embodiment of the present disclosure, the second electrode layer 314 may include an indium tin oxide layer, a silver metal layer, and an indium tin oxide layer stacked in sequence.

At least one of the first electrode layer 312 and the second electrode layer 314 is used to form a touch electrode, so as to generate a touch signal in response to a touch operation.

For example, in an embodiment of the present disclosure, the first electrode layer 312 is formed with a plurality of first touch electrodes, and the first touch electrodes extend along the first direction. The second electrode layer 314 is formed with a plurality of second touch electrodes, and the second touch electrodes extend along the second direction. The first direction and the second direction are perpendicular to each other. Preferably, among the first direction and the second direction, one is the row direction of the touch display panel, and the other is the column direction of the touch display panel. The row direction is the extension direction of the data lead in the driving circuit layer, and the row direction is the extension direction of the scan lead in the driving circuit layer.

As another example, in another embodiment of the present disclosure, the first electrode layer 312 includes a plurality of bridge leads distributed in an array, and the second electrode layer 314 includes a plurality of first electrodes arranged along the first direction and a plurality of second electrodes arranged along the second direction. The first direction is perpendicular to the second direction. The first electrode includes a plurality of first sub-electrodes arranged along the second direction and connected in sequence. The second electrode includes a plurality of second sub-electrodes arranged in the first direction and connected in sequence through bridge leads.

For another example, in another implementation of the present disclosure, the first electrode layer 312 is formed with a plurality of touch leads, and the second electrode layer 314 is formed with touch electrodes distributed in an array. Each touch electrode is electrically connected with a respective touch lead.

Optionally, the touch function layer may be formed according to the method shown in steps S310-S350.

Figure 4:
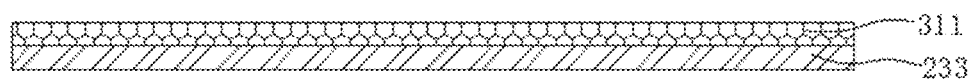
FIG. 4 is a schematic diagram about forming a dielectric buffer layer according to an embodiment of the present disclosure.

In step S310, referring to FIG. 4, a dielectric buffer layer 311 is formed on the side of the second inorganic encapsulation layer 233 away from the base substrate 100.

Figure 5:
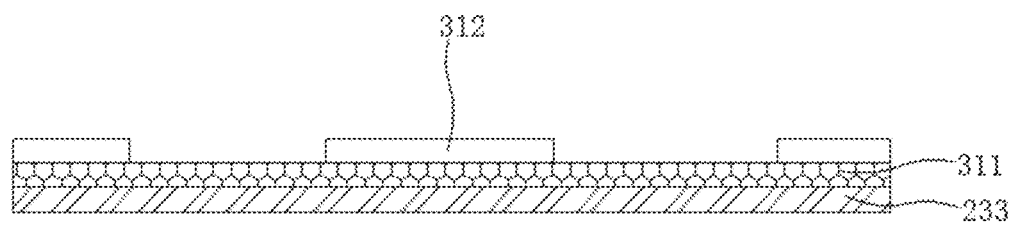
FIG. 5 is a schematic diagram about forming a first electrode layer according to an embodiment of the present disclosure.

In step S320, referring to FIG. 5, the first electrode layer 312 is formed on the side of the dielectric buffer layer 311 away from the base substrate 100.

Figure 6:
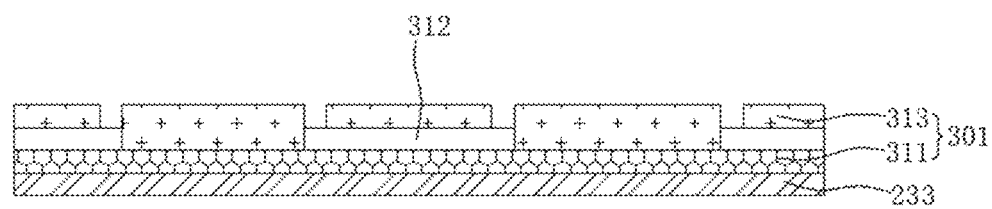
FIG. 6 is a schematic diagram about forming a dielectric insulation layer according to an embodiment of the present disclosure.

In step S330, referring to FIG. 6, a dielectric insulation layer 313 is formed on the side of the first electrode layer 312 away from the base substrate 100, and the dielectric insulation layer 313 is provided with a through hole exposing a partial area of the first electrode layer 312.

Figure 7:
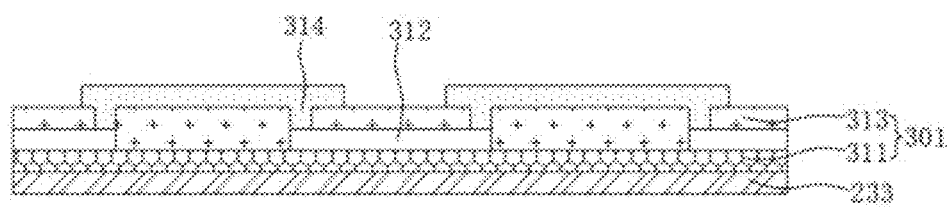
FIG. 7 is a schematic diagram about forming a second electrode layer according to an embodiment of the present disclosure.

In step S340, referring to FIG. 7, a second electrode layer 314 is formed on the side of the dielectric insulation layer 313 away from the base substrate 100, and the second electrode layer 314 is electrically connected to the first electrode layer 312 through a through hole.

In step S350, referring to FIG. 3, an organic protection layer 315 is formed on the side of the second electrode layer 314 away from the base substrate 100.

Optionally, when forming the touch function layer 300, the inorganic dielectric layer 301 and the organic protection layer 315 may be formed on the side of the display device layer 200 away from the base substrate 100, so that the orthographic projection of the inorganic dielectric layer 301 on the base substrate 100 is located within the orthographic projection of the organic protection layer 315 on the base substrate 100. In this way, in the formed touch display panel, the orthographic projection of the inorganic dielectric layer 301 on the base substrate 100 is located within the orthographic projection of the organic protection layer 315 on the base substrate 100. That is, the inorganic dielectric layer 301 is completely covered by the organic protection layer 315, and the junction area between the inorganic dielectric layer 301 and the display device layer 200 is completely covered by the organic protection layer 315. This helps to prevent water vapor from invading the junction area between the inorganic dielectric layer 301 and the display device layer 200, thereby avoiding the problem of peeling off of the touch function layer 300 during the process of manufacturing the touch display panel.

Optionally, when forming the touch function layer 300, a distance between any point on the edge of the orthographic projection of the inorganic dielectric layer 301 on the base substrate 100 and any point on the edge of the orthographic projection of the organic protection layer 315 on the base substrate 100 has a minimum value being not less than 80 microns. In other words, when forming the touch function layer 300, the edge of the organic protection layer 315 may exceed the edge of the inorganic dielectric layer 301 by at least 80 microns. Thus, in the formed touch display panel, a distance between any point on the edge of the orthographic projection of the inorganic dielectric layer 301 on the base substrate 100 and any point on the edge of the orthographic projection of the organic protection layer 315 on the base substrate 100 has a minimum value being not less than 80 microns.

In the touch display panel and the manufacturing process thereof water vapor needs to pass through the junction area between the organic protection layer 315 and the display device layer 200 before reaching the inorganic dielectric layer 301, and the length of the junction area is at least 80 microns. This causes the water vapor intrusion path to be elongated to at least 80 microns, so that the water vapor basically cannot reach the inorganic dielectric layer 301, thereby preventing the inorganic dielectric layer 301 from peeling off.

Optionally, referring to FIG. 11 to FIG. 15 as well as FIG. 17, there is a gap between an edge of the touch display panel and an edge of the organic protection layer 315 close to the edge of the touch display panel. In other words, the organic protection layer 315 may not extend to the edge of the touch display panel. In this way, it is helpful to cut the touch display panel or open through holes in the touch display panel.

Figure 8:
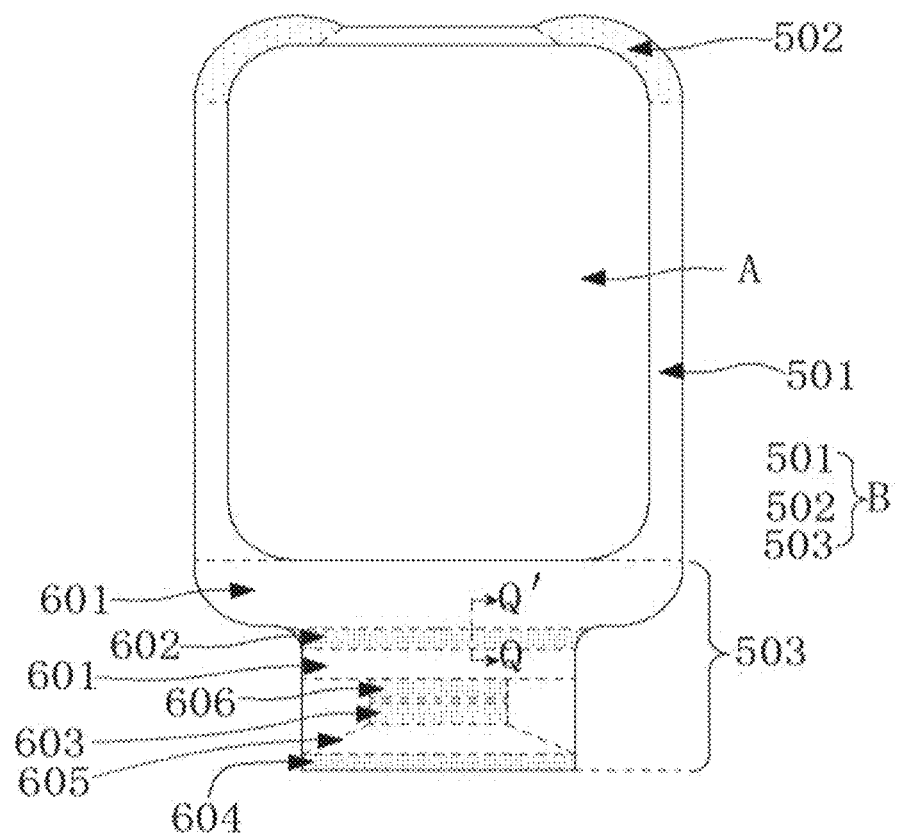
FIG. 8 is a schematic top view of a touch display panel according to an embodiment of the present disclosure.
Figure 10:
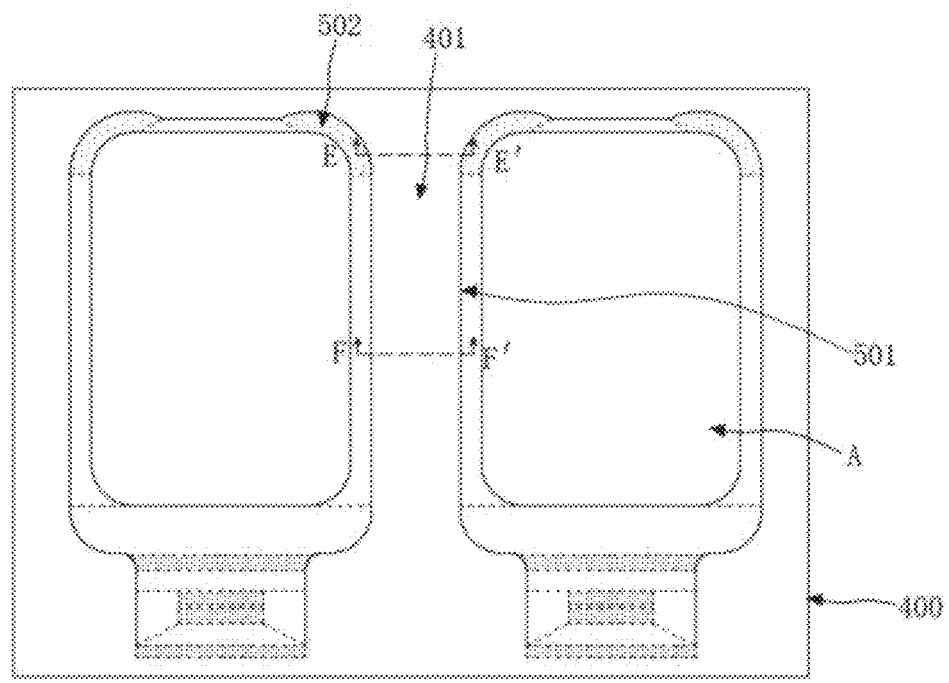
FIG. 10 is a schematic top view of the substrate motherboard before the touch display panel is uncut according to an embodiment of the present disclosure.

Referring to FIG. 8, as seen from the top view, the touch display panel may include a display area A and a peripheral area B surrounding the display area A. Referring to FIG. 9 and FIG. 10, on the substrate motherboard 400, the peripheral area B is surrounded by a cutting channel area 401. Referring to FIG. 17, in some implementations, the touch display panel may also be provided with a through hole and a through hole encapsulation area 5041 surrounding the through hole. During the manufacturing process, the base substrate has a through hole area for forming a through hole 504.

In areas such as the peripheral area B and the through-hole encapsulation area 5041, part or all of the inorganic material film layers of the display device layer 200 may form the inorganic insulation layer 202. For example, the inorganic insulation layer 202 may include film layers such as a buffer material layer 211, a gate insulation layer 213, an interlayer dielectric layer 215, and a passivation layer. Preferably, referring to FIG. 3, the inorganic insulation layer 202 may include a buffer material layer 211 and an interlayer dielectric layer 215. In areas such as the peripheral area B and the through-hole encapsulation area 5041, part or all of the organic material film layers of the display device layer 200 may form the organic material layer 201. For example, the organic material layer 201 may include film layers such as a planarization layer 217, a pixel electrode layer 221, and a support post layer 223. Preferably, referring to FIG. 3, the organic material layer 201 may be a planarization layer 217.

In some implementations, the inorganic insulation layer 202 may be thinned in the cutting channel area 401, so as to reduce the stress during cutting the substrate motherboard 400 and reduce the number and length of cracks. Further, the inorganic insulation layer 202 may also be thinned near the part of the cutting channel area 401 in the peripheral area B, so as to further reduce the stress during cutting the mother substrate 400 and reduce the number and length of cracks.

In some implementations, referring to FIG. 11 to FIG. 15, at the position where the peripheral area B is close to the edge of the touch display panel, the inorganic insulation layer 202 may also be provided with a groove 5012 extending along the extension direction of the edge of the touch display panel. The groove 5012 enables the inorganic insulation layer 202 to form a crack dam 5013 extending along the extension direction of the edge of the touch display panel. In this way, the crack dam 5013 and the groove 5012 help to prevent the cracks on the edge of the touch display panel from continuing to extend toward the display area A, thereby improving the yield and life of the touch display panel.

Optionally, the number of crack dams 5013 may be multiple. The multiple crack dams 5013 extend along the extension direction of the edge of the touch display panel, and are arranged sequentially along a direction from the display area to the edge of the touch display panel. Exemplarily, the number of crack dams 5013 is 2 to 6.

Optionally, the crack dam 5013 disposed in the peripheral area B may surround the display area A.

Optionally, for the crack dam 5013 closest to the edge of the touch display panel, the distance between the edges of the touch display panel is 100 to 200 microns.

Figure 11:
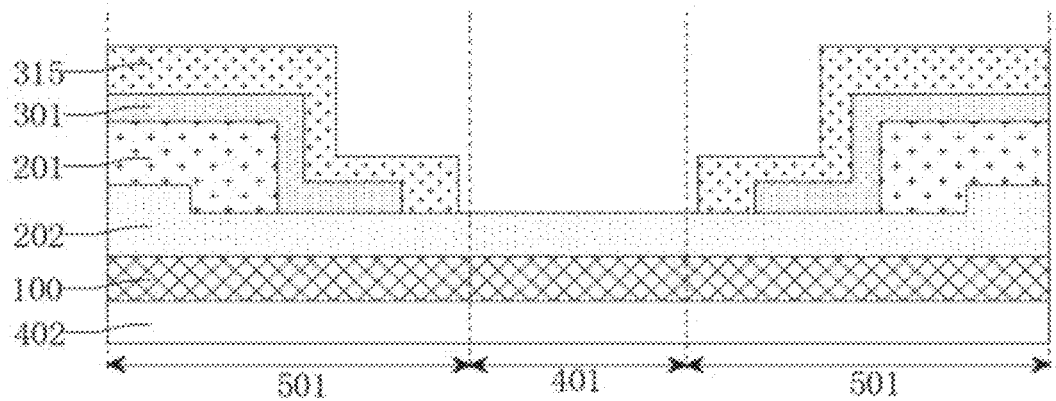
FIG. 11 is a schematic cross-sectional view at the position FF' in FIG. 10 according to an embodiment of the present disclosure.
Figure 12:
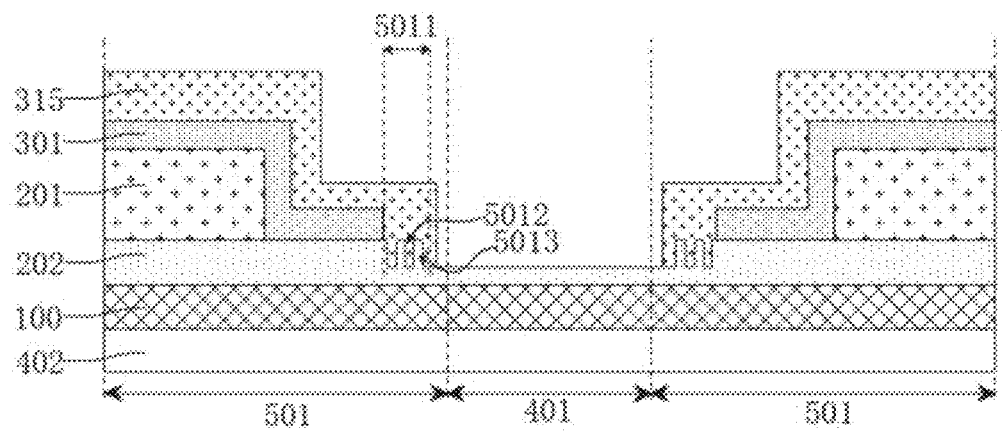
FIG. 12 is a schematic cross-sectional view at the position FF' in FIG. 10 according to an embodiment of the present disclosure.

In an embodiment of the present disclosure, referring to FIG. 8 and FIG. 10, the peripheral area B at least includes the first area 501. Referring to FIG. 11 and FIG. 12, in the first area 501, the edge of the organic material layer 201 is located within the edge of the inorganic dielectric layer 301. In other words, in the first area 501, the organic material layer 201 cannot reach the edge of the touch base substrate 100. The orthographic projection of the organic material layer 201 on the base substrate is located within the orthographic projection of the inorganic dielectric layer 301 on the base substrate 100.

In this way, in step S120, the organic material layer 201 of the display device layer 200 may be formed. In step S130, when forming the touch function layer 300, the inorganic dielectric layer 301 may be formed. In the first area 501, the edge of the organic material layer 201 is located within the edge of the inorganic dielectric layer 301. In this way, in the first area 501, the edge of the organic material layer 201 is covered by the inorganic dielectric layer 301, which renders the junction area between the organic material layer 201 and the inorganic dielectric layer 301 to be in protection by the inorganic dielectric layer 301. Thus, it is difficult for water vapor to invade the junction area between the organic material layer 201 and the inorganic dielectric layer 301, which helps to avoid the water vapor intrusion and the reduced bonding strength between the two caused thereby, and further prevents the inorganic dielectric layer 301 from being peeled off from the organic material layer 201 and thus causing the touch function layer 300 to be peeled off.

Further, in step S120, the inorganic insulation layer 202 of the display device layer 200 may also be formed, and the organic material layer 201 is located on the side of the inorganic insulation layer 202 away from the base substrate 100. In the first area 501, the edge of the organic material layer 201 is located inside the edge of the inorganic insulation layer 202. In step S130, when forming the inorganic dielectric layer 301, in the first area 501, the part of the inorganic insulation layer 202 beyond the organic material layer 201 is directly connected to the part of the inorganic dielectric layer 301 beyond the organic material layer 201. In this way, in the first area 501, the organic material layer 201 is completely covered between the inorganic dielectric layer 301 and the inorganic insulation layer 202, thereby making it difficult for water vapor to invade the organic material layer 201 and cause the touch function layer 300 to peel off. Furthermore, both the inorganic dielectric layer 301 and the inorganic insulation layer 202 are inorganic materials, which not only have greater compactness and stronger water resistance ability, but also have higher adhesion between the two. This helps to make it more difficult for water vapor to invade the organic material layer 201 in part of the edge area of the touch display panel.

Further, referring to FIG. 12, in the first area 501, the touch display panel has a crack barrier area 5011 close to the edge of the touch display panel and extending along the extension direction of the edge of the touch display panel. In step S120, when forming the inorganic insulation layer 202, in the first area 501, the inorganic insulation layer 202 covers the crack barrier area 5011, and a groove 5012 extending along the extension direction of the edge of the touch display panel is provided in the crack barrier area 5011. In step S130, when forming the organic protection layer 315, in the first area 501, the organic protection layer 315 covers the crack barrier area 5011.

In this way, referring to FIG. 12, in the first area 501, there is a crack barrier area 5011 between the edge of the inorganic dielectric layer 301 and the edge of the touch display panel, and the crack barrier area 5011 extends along the extension direction of the edge of the touch display panel. In the first area 501, the inorganic insulation layer 202 covers the crack barrier area 5011, and a groove 5012 extending along the extension direction of the edge of the touch display panel is disposed in the crack barrier area 5011. The organic protection layer 315 covers the crack barrier area 5011.

In this way, in the first area 501, the inorganic insulation layer 202 forms a crack dam 5013 in the crack barrier area 5011, and the groove 5012 is filled with organic materials. Thus, the crack dam 5013 and the groove 5012 block cracks together from extending to the side of the display area A.

Optionally, in step S110, a substrate motherboard 400 may be provided, and the substrate motherboard 400 includes base substrates 100 for a plurality of touch display panels and cutting channel areas 401 surrounding each base substrate 100. In step S120, the organic material layer 201 of each touch display panel may be formed on the substrate motherboard 400. The organic material layer 201 not only exposes the cutting channel area 401 adjacent to the first area 501, but also does not extend to the edge of the touch display panel in the first area 501. Thus, in the first area 501, an region exists between the organic material layer 201 and the edge of the touch display panel where the inorganic insulation layer 202 is exposed. In step S130, the edge of the inorganic dielectric layer 301 in the first area 501 is located outside the edge of the organic material layer 201, so that the inorganic dielectric layer 301 protrudes beyond the organic material layer 201 to be directly connected with the inorganic insulation layer 202. In this way, the edge of the organic material layer 201 is covered by the inorganic material, which further avoids the problem of water vapor invasion into the contact area between the organic material layer 201 and the inorganic dielectric layer 301 in the first area 501, and prevents the inorganic dielectric layer 301 from peeling off. Further, in step S120, the inorganic insulation layer 202 may be made to cover the first area 501, and extend to cover the cutting channel area 401 adjacent to the first area 501.

Figure 13:
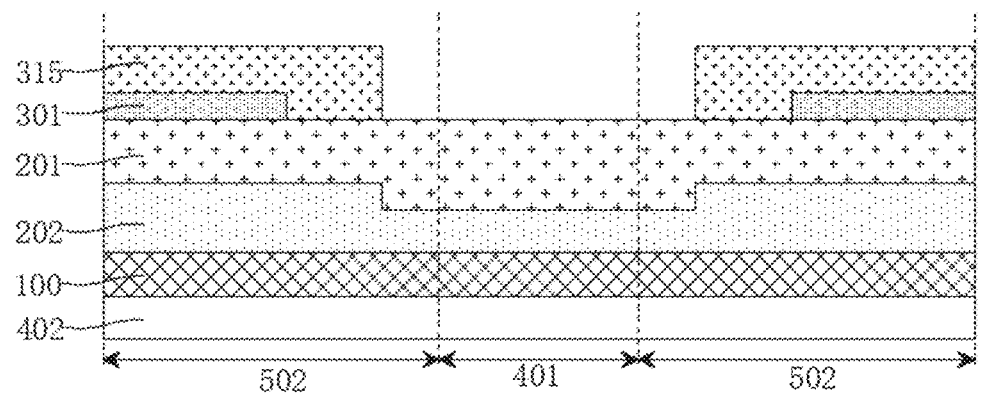
FIG. 13 is a schematic cross-sectional view at the position EE' in FIG. 10 according to an embodiment of the present disclosure.
Figure 14:
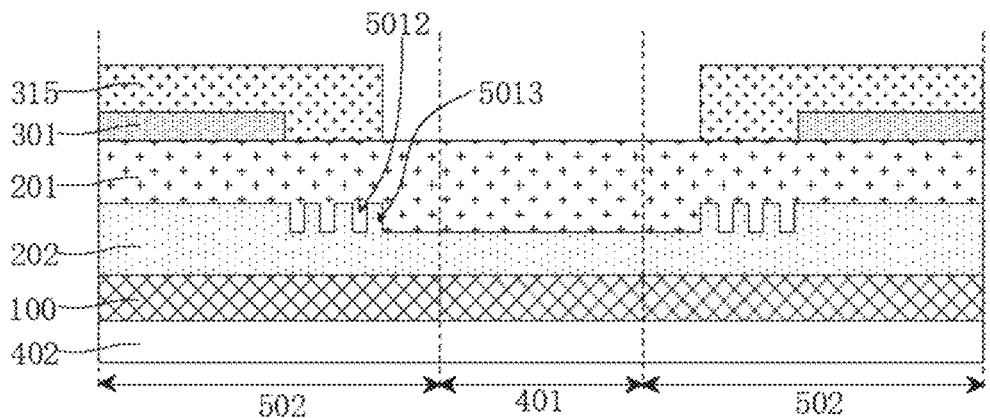
FIG. 14 is a schematic cross-sectional view at the position EE' in FIG. 10 according to an embodiment of the present disclosure.

In some embodiments of the present disclosure, referring to FIG. 8 and FIG. 10, the peripheral area B of the touch display panel may include a second area 502, and the edge of the touch display panel in the second area 502 is arc-shaped. FIG. 13 is a cross-sectional view taken along EE' in FIG. 10 according to an embodiment of the present disclosure. FIG. 14 is a cross-sectional view taken along EE' in FIG. 10 according to another embodiment of the present disclosure.

Referring to FIG. 10, FIG. 13, and FIG. 14, in step S110, a substrate motherboard 400 may be provided, and the substrate motherboard 400 includes base substrates 100 for a plurality of touch display panels and cutting channel areas 401 surrounding each base substrate 100. In step S120, the organic material layer 201 of each touch display panel may be formed on the substrate motherboard 400, and the organic material layer 201 further extends to cover the part of the cutting channel area 401 close to the second area 502. In step S130, when forming the inorganic dielectric layer 301, in the second area 502, the edge of the inorganic dielectric layer 301 does not reach the edge of the touch display panel.

In this way, in step S130, in the second area 502, there is an escape space between the edge of the inorganic dielectric layer 301 and the edge of the touch display panel, and the formed organic protection layer 315 may exceed the edge of the inorganic dielectric layer 301 and enter the escape space, thus being connected to the organic material layer 201 in the escape space.

In this way, when cutting the substrate motherboard 400 to form individual touch display panels, in the second area 502 and the cutting channel area 401 adjacent to the second area 502, the organic material layer 201 can balance the stress during cutting and reduce the occurrence of cracks. Also, the expansion of cracks can be reduced, thereby improving the yield rate of the touch display panel. Through cutting, a touch display panel with curved corners may be obtained. Preferably, the track of the edge of the touch display panel in the second area 502 is an arc.

In an embodiment, an independent touch display panel may be obtained by cutting and removing the cutting channel area 401. In the second area 502, the organic material layer 201 extends to the edge of the touch display panel. In the second area 502, the part of the organic protection layer 315 beyond the inorganic dielectric layer 301 may be directly connected with the organic material layer 201, so that the edge of the inorganic dielectric layer 301 is covered by the organic material. This helps to further inhibit water vapor from entering the junction area between the inorganic dielectric layer 301 and the organic material layer 201. Moreover, since both the organic material layer 201 and the organic protection layer 315 are made of organic materials, such as polyimide, they may be firmly bonded to further reduce the risk of peeling off the touch function layer 300.

In an embodiment of the present disclosure, referring to FIG. 14, in the second area 502, the inorganic insulation layer 202 may extend to cover the second area 502. The groove 5012 extends along the extension direction of the edge of the touch display panel at a position close to the edge of the touch display panel. The groove 5012 causes the inorganic insulation layer 202 to form a crack dam 5013 at a position near the edge of the touch display panel. The crack dam 5013 extends along the extension direction of the edge of the touch display panel. The groove 5012 is filled with the organic material of the organic material layer 201. In this way, when the substrate motherboard 400 is cut to form a touch display panel, the crack dam 5013 and the groove 5012 can block the extension of cracks to the display area A, thereby improving the yield of the touch display panel.

In an embodiment of the present disclosure, referring to FIG. 8, the peripheral area B of the touch display panel further includes a third area 503, and the touch display panel has a bendable area 602 in the third area 503.

Figure 15:
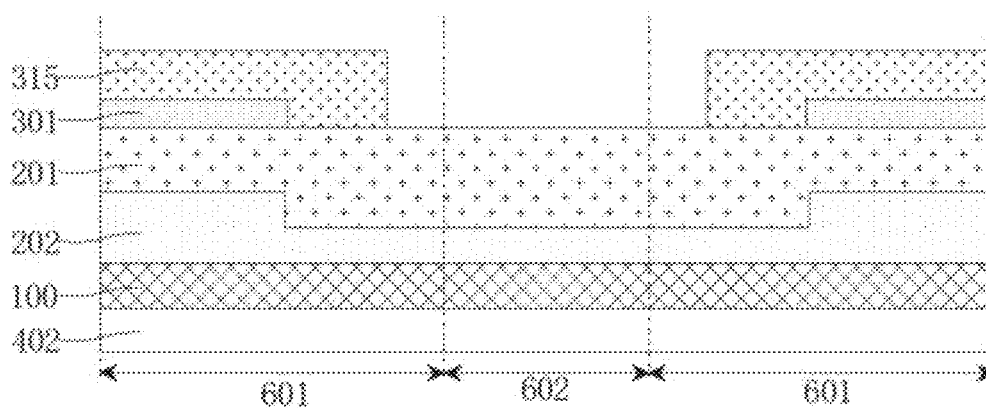
FIG. 15 is a schematic cross-sectional view at the position QQ' in FIG. 8.

Referring to FIG. 15, in step S120, when forming the organic material layer 201 of the display device layer, the organic material layer 201 covers the bendable area 602. In step S130, when forming the touch function layer 300, the inorganic dielectric layer 201 and the organic protection layer 315 are hollowed out in the bendable area 602. The edge of the organic protection layer 315 close to the bendable area 602 is located between the bendable area 602 and the edge of the inorganic dielectric layer 301 near the bendable area 602.

Thus, in the third area 503, the organic material layer 201 covers the bendable area 602, and the inorganic dielectric layer 201 and the organic protection layer 315 are hollowed out in the bendable area 602. The edge of the organic protection layer 315 close to the bendable area 602 is located between the bendable area 602 and the edge of the inorganic dielectric layer 301 close to the bendable area 602.

In this way, in the third area 503, at a position close to the bendable area 602, the organic protection layer 315 and the organic material layer 201 may be directly connected, so that the edge of the inorganic dielectric layer 301 near the bendable area 602 is closed and protected by the organic material. Moreover, the organic material layer 201 and the organic protection layer 315 may be firmly bonded, thereby further reducing the risk of peeling off the touch function layer 300.

Optionally, the third area 503 may be a part of the peripheral area B for setting the source driver, which may include different structures in different types of touch display panels.

For example, in an embodiment of the present disclosure, the base substrate 100 of the touch display panel may be a flexible base substrate 100. The touch display panel is a touch display panel with Chip on Panel (COP) structure. Then, the third area 503 may be provided with a fan-out area 601, a chip binding area 603, a connection lead area 605, and a circuit board binding area 604 which are away from the display area A in sequence. Fan-out leads may be set in the fan-out area 601, and chip pads may be set in the chip binding area 603. Part of the chip pads are electrically connected to the data lines and the touch lines in the display area A through the fan-out leads. The chip pads are used to bind the driver chip. Circuit board pads are provided in the circuit board binding area 604, and connection leads are provided in the connection lead area 605. The circuit board binding pads may be electrically connected to part of the chip pads through the connection leads. The circuit board binding pads are used to bind the driving circuit board, so as to interact with electronic devices other than the touch display panel through the driving circuit board, such as receiving display signals input by external electronic devices and outputting touch signals to external electronic devices. Optionally, the driving circuit board may be a flexible circuit board.

The bendable area 602 may be located in the fan-out area 601, or pass through the fan-out area 601 along the extension direction of the scan lines of the touch display panel. In the bendable area 602, the touch display panel may be bent toward the back side of the touch display panel (the side away from the touch function layer 300), thereby reducing the frame of the touch display panel and increasing the screen ratio.

Further, at an edge position of the third area 503, the edge of the inorganic dielectric layer 301 is located between the edge of the organic material layer 201 and the edge of the organic protection layer 315. In this way, at an edge position of the third area 503, the water vapor needs to pass through the organic protection layer 315 and the inorganic dielectric layer 301 continuously, so as to reach the junction area between the inorganic dielectric layer 301 and the organic material layer 201. This causes the path of water vapor intrusion to be prolonged and cannot invade the organic material layer 201, thereby preventing the inorganic dielectric layer 301 from peeling off.

Further, the touch display panel may also include a test area 606 in the third area 503, and the test area 606 is provided with a test unit, for acceptance testing (AT) at the process stage and for facilitating cell testing (CT) at the module stage. The test area 606 may be disposed between the chip binding area 603 and the bendable area 602.

Figure 16:
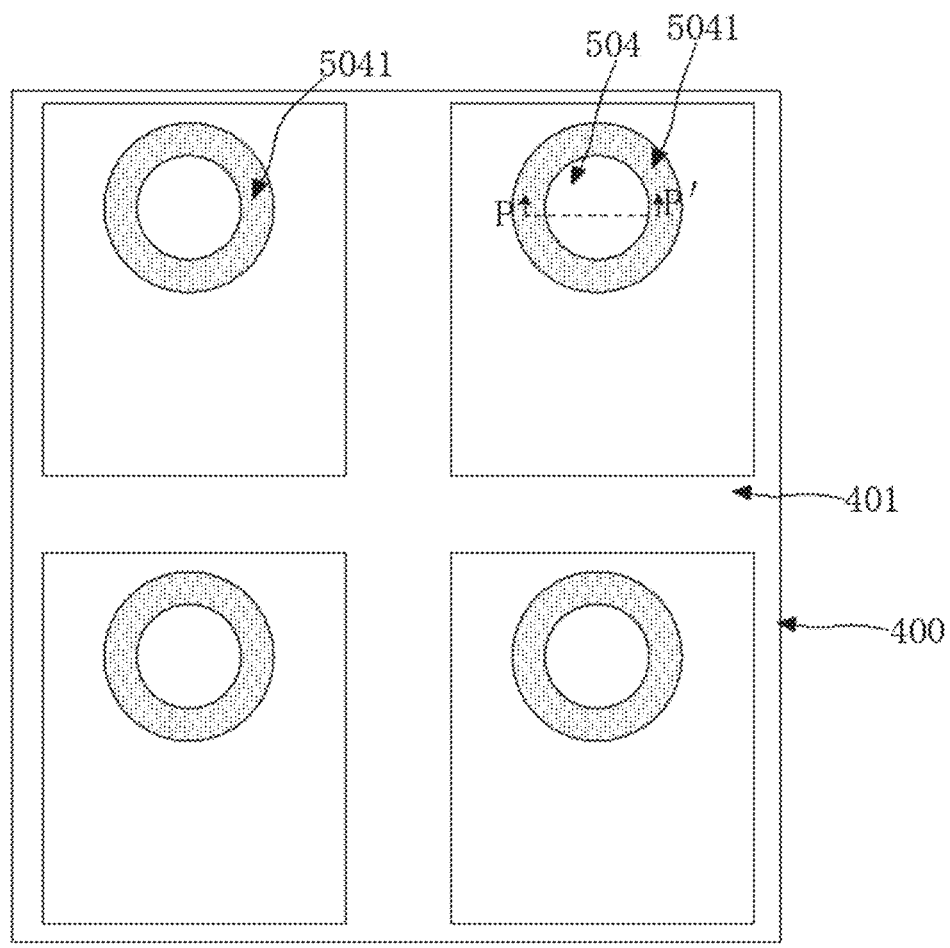
FIG. 16 is a schematic top view of the substrate motherboard before the touch display panel is uncut according to an embodiment of the present disclosure, where the touch display panel may be provided with a through hole.

In another embodiment of the present disclosure, referring to FIG. 16, the touch display panel is provided with a through hole. In step S130, when forming the organic protection layer 315, the orthographic projection of the organic protection layer 315 on the base substrate 100 surrounds the orthographic projection of the through hole on the base substrate. In this way, in the formed touch display panel, the orthographic projection of the organic protection layer 315 on the base substrate surrounds the orthographic projection of the through hole on the base substrate. In other words, the organic protection layer 315 may not extend to the edge of the through hole.

Further, referring to FIG. 16, the touch display panel is provided with a through hole and a through hole encapsulation area 5041 surrounding the through hole. During the manufacturing process, the base substrate has a through hole area 504 for forming a through hole.

Referring to FIG. 17, in step S120, the organic material layer 201 of the display device layer 200 may be formed such that the organic material layer 201 covers the through-hole encapsulation area 5041 and the through-hole area 504. In step S130, the inorganic dielectric layer 301 may be formed in the through-hole encapsulation area 5041, so that edges of the inorganic dielectric layer 301 and the organic protection layer 315 do not reach the edge of the through-hole area 504. In this way, when the through hole area 504 is opened to form a through hole, the organic material layer 201 can balance the stress during the process of opening, reduce the generation of cracks, and weaken the expansion of cracks, thereby improving the yield of the touch display panel. After the through hole is formed, the organic material layer 201 extends to the edge of the through hole in the through hole encapsulation area 5041, and there is a gap between the organic protection layer 315 and the edge of the through hole.

In the through-hole encapsulation area 5041, the part of the organic protection layer 315 beyond the inorganic dielectric layer 301 may be directly connected with the organic material layer 201, so that the edge of the inorganic dielectric layer 301 is covered by the organic material, thus further inhibiting water vapor from entering the junction area between the inorganic dielectric layer 301 and the organic material layer 201. Moreover, since both the organic material layer 201 and the organic protection layer 315 are made of organic materials, such as polyimide, they may be firmly bonded to further reduce the risk of peeling off the touch function layer 300.

In an embodiment of the present disclosure, referring to FIG. 17, in the through-hole encapsulation area 5041, the inorganic insulation layer 202 may be formed with a groove 5012, and the groove 5012 enables the inorganic insulation layer 202 to be formed with a crack dam 5013, so as to prevent propagation of cracks at the edge of the through hole. Further, a metal material layer (not shown in FIG. 17) may also be formed on the upper surface of the crack dam 5013, and the metal material layer may be provided in the same layer as the source-drain metal layer or the gate layer. On one hand, this increases the depth of the groove 5012 and improves the anti-crack effect. On the other hand, the crack dam 5013 may also make the organic light-emitting layer (not shown in FIG. 17) thereon to be separated from the common electrode layer (not shown in FIG. 17), thereby blocking the water and oxygen intrusion channel used for water and oxygen to intrude into the display area through the through-hole encapsulation area 5041.

The present disclosure also provides a touch display panel. As shown in FIG. 3, the touch display panel includes: a base substrate 100; a display device layer 200 disposed on a side of the base substrate 100; and a touch function layer 300 disposed on the side of the display device layer 200 away from the base substrate 100. The touch function layer 300 includes an inorganic dielectric layer 301 and an organic protection layer 315 sequentially stacked on the display device layer 200. Referring to FIG. 11 to FIG. 15 as well as FIG. 17, the orthographic projection of at least part of the edge of the inorganic dielectric layer 301 on the base substrate 100 is located within the orthographic projection of the organic protection layer 315 on the base substrate 100.

The touch display panel provided in the present disclosure may be manufactured according to the above-mentioned method for manufacturing the touch display panel. So, it has the same or similar technical effects, and the present disclosure will not be repeated in this regard.

In an embodiment of the present disclosure, the touch function layer 300 further includes a first electrode layer 312 and a second electrode layer 314. The inorganic dielectric layer 301 includes a dielectric buffer layer 311 and a dielectric insulation layer 313. The dielectric buffer layer 311, the first electrode layer 312, the dielectric insulation layer 313, the second electrode layer 314, and the organic protection layer 315 are sequentially stacked on the side of the display device layer 200 away from the base substrate 100.

In an embodiment of the present disclosure, the orthographic projection of the inorganic dielectric layer 301 on the base substrate 100 is located within the orthographic projection of the organic protection layer 315 on the base substrate 100.

In an embodiment of the present disclosure, a distance between any point on the edge of the orthographic projection of the inorganic dielectric layer 301 on the base substrate 100 and any point on the edge of the orthographic projection of the organic protection layer 315 on the base substrate 100 has a minimum value being not less than 80 microns.

In an embodiment of the present disclosure, referring to FIG. 11 to FIG. 15 as well as FIG. 17, there is a gap between the edge of the touch display panel and the edge of the organic protection layer 315 near the edge of the touch display panel.

In an embodiment of the present disclosure, the display device layer 200 includes an organic material layer 201, and the peripheral area B of the touch display panel includes a first area 501.

In the first area 501, the edge of the organic material layer 201 is located within the edge of the inorganic dielectric layer 301.

In an embodiment of the present disclosure, the display device layer 200 further includes an inorganic insulation layer 202, and the organic material layer 201 is located on a side of the inorganic insulation layer 202 away from the base substrate 100.

In the first area 501, the edge of the organic material layer 201 is located within the edge of the inorganic insulation layer 202, and the part of the inorganic insulation layer 202 beyond the organic material layer 201 is directly connected with the part of the inorganic dielectric layer 301 beyond the organic material layer 201.

In an embodiment of the present disclosure, in the first area 501, the touch display panel has a crack barrier area 5011 close to the edge of the touch display panel and extending along the extension direction of the edge of the touch display panel. In the first area 501, the inorganic insulation layer 202 covers the crack barrier area 5011, and a groove 5012 extending along the extension direction of the edge of the touch display panel is disposed in the crack barrier area 5011. The organic protection layer 315 covers the crack barrier area 5011.

In an embodiment of the present disclosure, the peripheral area B of the touch display panel further includes a second area 502.

In the second area 502, the edge of the touch display panel is arc-shaped, and the organic material layer 201 extends to the edge of the touch display panel.

In an embodiment of the present disclosure, the peripheral area B of the touch display panel further includes a bendable area 602. The organic material layer 201 covers the bendable area 602, and the inorganic dielectric layer 201 and the organic protection layer 315 are hollowed out in the bendable area 602. The edge of the organic protection layer 315 close to the bendable area 602 is located between the bendable area 602 and the edge of the inorganic dielectric layer 301 close to the bendable area 602.

In an embodiment of the present disclosure, the touch display panel is provided with a through hole. The orthographic projection of the organic protection layer 315 on the base substrate surrounds the orthographic projection of the through hole on the plane where the base substrate is located.

The touch display panel provided by embodiments of the present disclosure may be manufactured by the above-mentioned method for manufacturing a touch display pane. Various structures, principles and effects thereof have been described in the above-mentioned method for manufacturing a touch display panel, or may be reasonably concluded from the description about the method for manufacturing the touch display panel, and the present disclosure will not be repeated in this regard.

Embodiment Two

Figure 18:
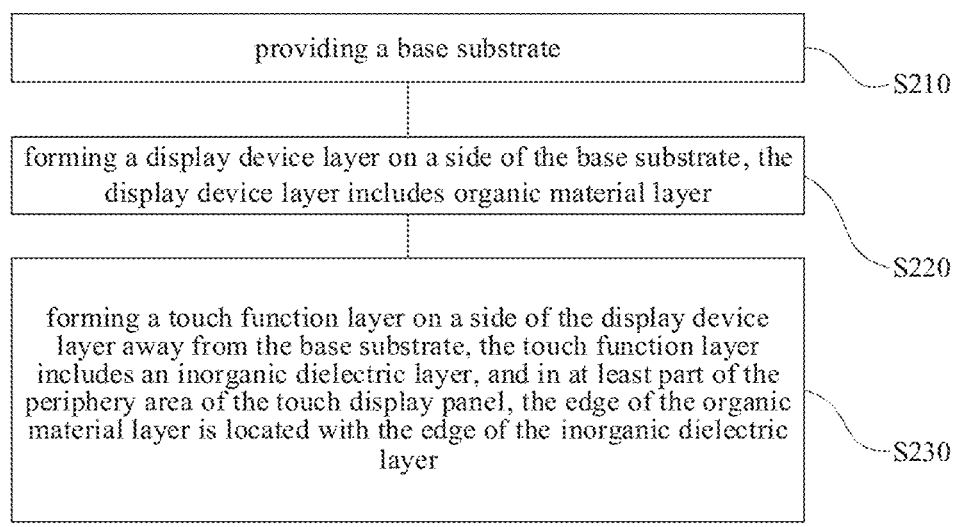
FIG. 18 is a schematic flowchart of a method for manufacturing a touch display panel according to an embodiment of the present disclosure.

The present disclosure provides another method for manufacturing a touch display panel. As shown in FIG. 18, the method for manufacturing a touch display panel includes: step S210, providing a base substrate 100; step S220, forming a display device layer 200 on one side of the base substrate 100, the display device layer 200 including an organic material layer 201; and step S230, forming a touch function layer 300 on the side of the display device layer 200 away from the base substrate 100, the touch function layer 300 including an inorganic dielectric layer 301. Referring to FIG. 11, in at least part of the peripheral area B of the touch display panel, the edge of the organic material layer 201 is located within the edge of the inorganic dielectric layer 301.

According to the method for manufacturing a touch display panel provided in the present disclosure, when forming the touch function layer 300, the edge of the organic material layer 201 may be located within the edge of the inorganic dielectric layer 301 in at least part of the edge area. In this way, in at least part of the edge area, the junction area between the organic material layer 201 and the inorganic dielectric layer 301 is under the protection by the inorganic dielectric layer 301. This helps to prevent water vapor from invading the junction area between the organic material layer 201 and the inorganic dielectric layer 301 in these edge areas, thereby preventing the inorganic dielectric layer 301 from peeling off.

According to the method for manufacturing a touch display panel provided in the present disclosure, the manufactured touch display panel includes a base substrate 100, a display device layer 200, and a touch function layer 300 stacked in sequence. The display device layer 200 includes an organic material layer 201. The touch function layer 300 includes an inorganic dielectric layer 301. In at least part of the edge area of the touch display panel, the edge of the organic material layer 201 is located within the edge of the inorganic dielectric layer 301.

For example, referring to FIG. 8, as seen from a top view, the touch display panel may include a display area A and a peripheral area B surrounding the display area A. The peripheral area B may include a first area 501 and a third area 503. In edge areas of the first area 501 and the third area 503, the edge of the organic material layer 201 is located within the edge of the inorganic dielectric layer 301.

Optionally, the display device layer 200 may also include an inorganic insulation layer 202. In the edge areas of the first area 501 and the third area 503, the inorganic dielectric layer 301 and the inorganic insulation layer 202 may exceed the organic material layer 201 and be directly connected. In this way, in these edge areas, the edge of the organic material layer 201 is covered by the inorganic material, which prevents water vapor from intruding into the organic material layer 201 and causing the inorganic dielectric layer 301 to peel off.

The present disclosure further provides another touch display panel, including: a base substrate 100; a display device layer 200 disposed on one side of the base substrate 100, the display device layer 200 including an organic material layer 201; and a touch function layer 300 arranged on the side of the display device layer 200 away from the base substrate 100. The touch function layer 300 includes an inorganic dielectric layer 301. In at least part of the peripheral area B of the touch display panel, the edge of the organic material layer 201 is located within the edge of the inorganic dielectric layer 301.

The touch display panel provided by embodiments of the present disclosure may be manufactured by the above-mentioned method for manufacturing a touch display panel. Various structures, principles and effects thereof have been described in the above-mentioned description about the method for manufacturing the touch display panel, or may be reasonably deduced from the description about the above-mentioned method for manufacturing the touch display panel, and the present disclosure will not be repeated in this regard.

In Embodiment Two, principles, effects and details of various steps and structures are described in detail in the corresponding Embodiment One, or may be reasonably deduced from the description of the corresponding Embodiment One, and the present disclosure will not be repeated in this regard.

Embodiment Three

Embodiments of the present disclosure further provide a display device, which includes any touch display panel described in the implementations of the touch display panel in Embodiment One and Embodiment Two above. The display device may be a mobile phone screen, a tablet computer screen, or other types of display devices. Since the display device has any one of the touch display panels described in the above implementations about the touch display panel, it has the same beneficial effect, and the present disclosure will not be repeated in this regard.

It should be understood that the present disclosure is not limited in its application to the detailed construction and arrangement of components set forth in the specification. The present disclosure is capable of other embodiments and of being practiced and carried out in various ways. The foregoing variations and modifications fall within the scope of the present disclosure. It shall be understood that the content disclosed and defined in the specification extends to all alternative combinations of two or more of the individual features mentioned or evident in the text and/or drawings. All of these different combinations constitute alternative aspects of the present disclosure. The embodiments described herein describe the best mode known for carrying out the present disclosure and will enable others skilled in the art to utilize the present disclosure.

What is claimed:
1. A touch display panel, comprising:
a base substrate;
a display device layer, arranged on a side of the base substrate;
a touch function layer, arranged on a side of the display device layer away from the base substrate, wherein
the touch function layer comprises an inorganic dielectric layer and an organic protection layer sequentially stacked on the display device layer; and
an orthographic projection of at least part of an edge of the inorganic dielectric layer on the base substrate is located within an orthographic projection of the organic protection layer on the base substrate, wherein
the display device layer comprises an organic material layer;
a peripheral area of the touch display panel comprises a first area;
in the first area, an edge of the organic material layer is located within the edge of the inorganic dielectric layer;
the peripheral area of the touch display panel further comprises a bendable area; and
the organic material layer covers the bendable area, and the inorganic dielectric layer and the organic protection layer are hollowed out in the bendable area, wherein
an edge of the organic protection layer close to the bendable area is located between the bendable area and an edge of the inorganic dielectric layer close to the bendable area.
2. The touch display panel according to claim 1, wherein
the touch function layer further comprises a first electrode layer and a second electrode layer;
the inorganic dielectric layer comprises a dielectric buffer layer and a dielectric insulation layer; and
the dielectric buffer layer, the first electrode layer, the dielectric insulation layer, the second electrode layer, and the organic protection layer are sequentially stacked on a side of the display device layer away from the base substrate.
3. The touch display panel according to claim 1, wherein
an orthographic projection of the inorganic dielectric layer on the base substrate is located within the orthographic projection of the organic protection layer on the base substrate.
4. The touch display panel according to claim 1, wherein
a gap exists between an edge of the touch display panel and an edge of the organic protection layer close to the edge of the touch display panel.
5. The touch display panel according to claim 1, wherein
the display device layer further comprises an inorganic insulation layer, and the organic material layer is located on a side of the inorganic insulation layer away from the base substrate; and
in the first area, the edge of the organic material layer is located within an edge of the inorganic insulation layer, and a part of the inorganic insulation layer beyond the organic material layer is directly connected with a part of the inorganic dielectric layer beyond the organic material layer.
6. The touch display panel according to claim 5, wherein
in the first area, a crack barrier area exists between the edge of the inorganic dielectric layer and an edge of the touch display panel, and the crack barrier area extends along an extension direction of the edge of the touch display panel; and
in the first area, the inorganic insulation layer covers the crack barrier area, a groove extending along the extension direction of the edge of the touch display panel is arranged in the crack barrier area, and the organic protection layer covers the crack barrier area.

7. The touch display panel according to claim 1, wherein the peripheral area of the touch display panel further comprises a second area; and in the second area, an edge of the touch display panel is arc-shaped, and the organic material layer extends to the edge of the touch display panel.

8. The touch display panel according to claim 1, wherein the touch display panel is provided with a through hole, and the orthographic projection of the organic protection layer on the base substrate surrounds an orthographic projection of the through hole on the base substrate.

9. A display device, comprising the touch display panel according to claim 1.

10. The touch display panel according to claim 1, wherein a distance between any point on an edge of an orthographic projection of the inorganic dielectric layer on the base substrate and any point on an edge of the organic protection layer on the base substrate has a minimum value being not less than 80 micron.

11. A method for manufacturing a touch display panel, comprising:

providing a base substrate;

forming a display device layer on a side of the base substrate;

forming a touch function layer on a side of the display device layer away from the base substrate, wherein the touch function layer comprises an inorganic dielectric layer and an organic protection layer sequentially stacked on the display device layer; and an orthographic projection of at least part of an edge of the inorganic dielectric layer on the base substrate is located within an orthographic projection of the organic protection layer on the base substrate, wherein the peripheral area of the touch display panel comprises a first area;

forming the display device layer on the side of the base substrate comprises:

forming an organic material layer of the display device layer; and forming the touch function layer on the side of the display device layer away from the base substrate comprises:

forming the inorganic dielectric layer, such that in the first area, an edge of the organic material layer is located within the edge of the inorganic dielectric layer, wherein the peripheral area of the touch display panel further comprises a bendable area;

forming the display device layer on the side of the base substrate comprises:

while forming the organic material layer of the display device layer, covering the bendable area by the organic material layer; and forming the touch function layer on the side of the display device layer away from the base substrate comprises:

forming the touch function layer, such that the inorganic dielectric layer and the organic protection layer are hollowed out in the bendable area, wherein an edge of the organic protection layer close to the bendable area is located between the bendable area and an edge of the inorganic dielectric layer close to the bendable area.

12. The method for manufacturing a touch display panel according to claim 11, wherein forming the touch function layer on the side of the display device layer away from the base substrate comprises:

forming the inorganic dielectric layer and the organic protection layer on a side of the display device layer away from the base substrate, such that an orthographic projection of the inorganic dielectric layer on the base substrate is located within the orthographic projection of the organic protection layer on the base substrate.

13. The method for manufacturing a touch display panel according to claim 11, wherein forming the display device layer on the side of the base substrate further comprises:

forming the inorganic insulation layer of the display device layer, such that the organic material layer is located on a side of the inorganic insulation layer away from the base substrate, and in the first area, the edge of the organic material layer is located within an edge of the inorganic insulation layer; and forming the touch function layer on the side of the display device layer away from the base substrate further comprises:

while forming the inorganic dielectric layer, in the first area, directly connecting a part of the inorganic insulation layer beyond the organic material layer with a part of the inorganic dielectric layer beyond the organic material layer.

14. The method for manufacturing a touch display panel according to claim 13, wherein in the first area, the touch display panel comprises a crack barrier area close to an edge of the touch display panel and extending along an extension direction of the edge of the touch display panel;

forming the display device layer on the side of the base substrate further comprises: while forming the inorganic insulation layer, in the first area, covering the crack barrier area by the inorganic insulation layer and providing a groove in the crack barrier area, wherein the groove extends along an extension direction of the edge of the touch display panel; and forming the touch function layer on the side of the display device layer away from the base substrate further comprises:

while forming the organic protection layer, in the first area, covering the crack barrier area by the organic protection layer.

15. The method for manufacturing a touch display panel according to claim 11, wherein the peripheral area of the touch display panel further comprises a second area, and an edge of the touch display panel in the second area is arc-shaped;

providing the base substrates comprises:

providing a substrate motherboard, wherein the substrate motherboard comprises base substrates for a plurality of touch display panels and cutting channel areas surrounding each base substrate;

forming the display device layer on the side of the base substrate comprises:

forming the organic material layer of each touch display panel on the substrate motherboard, wherein the organic material layer further extends to cover a part of the cutting channel area close to the second area; and forming the touch function layer on the side of the display device layer away from the base substrate comprises:

while forming the inorganic dielectric layer, in the second area, rendering the edge of the inorganic dielectric layer to not reach the edge of the touch display panel.

\* \* \* \* \*